(12) United States Patent
Holzmüller et al.

(10) Patent No.: US 11,888,062 B2
(45) Date of Patent: Jan. 30, 2024

(54) EXTENDED-DRAIN METAL-OXIDE-SEMICONDUCTOR DEVICES WITH A SILICON-GERMANIUM LAYER BENEATH A PORTION OF THE GATE

(71) Applicant: GLOBALFOUNDRIES U.S. Inc., Malta, NY (US)

(72) Inventors: Felix Holzmüller, Dresden (DE); Ruchil K. Jain, Dresden (DE); Peter Baars, Dresden (DE)

(73) Assignee: GlobalFoundries U.S. Inc., Malta, NY (US)

(*) Notice: Subject to any disclaimer, the term of this patent is extended or adjusted under 35 U.S.C. 154(b) by 173 days.

(21) Appl. No.: 17/491,850

(22) Filed: Oct. 1, 2021

(65) Prior Publication Data

US 2023/0106168 A1     Apr. 6, 2023

(51) Int. Cl.
*H01L 29/78* (2006.01)
*H01L 29/08* (2006.01)
*H01L 29/10* (2006.01)
*H01L 29/66* (2006.01)
(Continued)

(52) U.S. Cl.
CPC ...... *H01L 29/7816* (2013.01); *H01L 29/0847* (2013.01); *H01L 29/1054* (2013.01); *H01L 29/66659* (2013.01); *H01L 29/66681* (2013.01); *H01L 29/7835* (2013.01)

(58) Field of Classification Search
CPC ....... H01L 21/823456; H01L 21/82385; H01L 29/7816; H01L 29/0847; H01L 29/66681; H01L 29/66659; H01L 29/7838; H01L 29/1054; H01L 21/823412; H01L 21/823807; H01L 29/0856; H01L 29/7835; H01L 29/165; H01L 29/7836; H01L 29/66575; H01L 21/823418; H01L 21/823814; H01L 29/7833; H01L 21/823892; H01L 27/0928; H01L 29/1095; H01L 27/0617; H01L 29/4983; H01L 29/1045; H01L 29/0638; H01L 29/0619;
(Continued)

(56) References Cited

U.S. PATENT DOCUMENTS 9,177,803 B2     11/2015   Javorka et al.
9,472,659 B2 *   10/2016   Noh ................... H01L 29/1054
(Continued)

*Primary Examiner* — Sonya McCall-Shepard
(74) *Attorney, Agent, or Firm* — Thompson Hine LLP; Anthony Canale

(57) ABSTRACT

Structures for an extended-drain metal-oxide-semiconductor device and methods of forming a structure for an extended-drain metal-oxide-semiconductor device. The structure includes a semiconductor substrate containing a first semiconductor material, a source region and a drain region in the semiconductor substrate, a gate electrode positioned in a lateral direction between the source region and the drain region, and a semiconductor layer positioned on the semiconductor substrate. The semiconductor layer contains a second semiconductor material that differs in composition from the first semiconductor material. The gate electrode includes a first section positioned in a vertical direction over the semiconductor layer and a second section positioned in the vertical direction over the semiconductor substrate.

20 Claims, 5 Drawing Sheets

(51) Int. Cl.
*H01L 29/165* (2006.01)
*H01L 29/51* (2006.01)
(58) Field of Classification Search
CPC ............. H01L 29/4238; H01L 29/0865; H01L 29/0882
See application file for complete search history.

(56) References Cited

U.S. PATENT DOCUMENTS

| | | | |
|---|---|---|---|
| 2001/0045604 A1* | 11/2001 | Oda | H01L 27/0922 257/350 |
| 2005/0199962 A1* | 9/2005 | Suzuki | H01L 29/7835 257/368 |
| 2012/0098067 A1 | 4/2012 | Yin et al. | |
| 2012/0153401 A1* | 6/2012 | Javorka | H01L 21/82385 257/E27.06 |
| 2016/0005734 A1 | 1/2016 | Javorka et al. | |

* cited by examiner

US 11,888,062 B2

EXTENDED-DRAIN METAL-OXIDE-SEMICONDUCTOR DEVICES WITH A SILICON-GERMANIUM LAYER BENEATH A PORTION OF THE GATE

BACKGROUND

The invention relates generally to semiconductor device and integrated circuit fabrication and, in particular, structures for an extended-drain metal-oxide-semiconductor device and methods of forming a structure for an extended-drain metal-oxide-semiconductor device.

High-voltage integrated circuits used, for example, in microwave and radiofrequency power amplifiers typically require specialized circuit technology capable of withstanding higher voltages. Extended-drain metal-oxide-semiconductor (EDMOS) devices, also known as laterally-diffused metal-oxide-semiconductor (LDMOS) devices, are designed to incorporate additional features, such as a lightly-doped extended drain, that promote the higher voltage handling capability.

Some types of extended-drain metal-oxide-semiconductor devices may exhibit a threshold voltage that is higher than desired. In particular, p-type extended-drain metal-oxide-semiconductor devices that include a metal gate may require some type of adjustment, during fabrication, for the purpose of reducing the threshold voltage. The threshold voltage may be adjusted by an additional implant into the well beneath the gate. However, implantation adds a mask to the fabrication process. Other corrective measures for adjusting the threshold voltage may cause degradation of the linear drain current during operation.

Improved structures for an extended-drain metal-oxide-semiconductor device and methods of forming an extended-drain metal-oxide-semiconductor device are needed.

SUMMARY

In an embodiment, a structure for an extended-drain metal-oxide-semiconductor device is provided. The structure includes a semiconductor substrate comprised of a first semiconductor material, a source region and a drain region in the semiconductor substrate, a gate electrode positioned in a lateral direction between the source region and the drain region, and a semiconductor layer positioned on the semiconductor substrate. The semiconductor layer is comprised of a second semiconductor material that differs in composition from the first semiconductor material. The gate electrode includes a first section positioned in a vertical direction over the semiconductor layer and a second section positioned in the vertical direction over the semiconductor substrate.

In an embodiment, a method of forming a structure for an extended-drain metal-oxide-semiconductor device is provided. The method includes forming a semiconductor layer positioned on a semiconductor substrate comprised of a first semiconductor material, forming a source region and a drain region in the semiconductor substrate, and forming a gate electrode positioned in a lateral direction between the source region and the drain region. The semiconductor layer is comprised of a second semiconductor material that differs in composition from the first semiconductor material. The gate electrode includes a first section positioned in a vertical direction over the semiconductor layer and a second section positioned in the vertical direction over the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
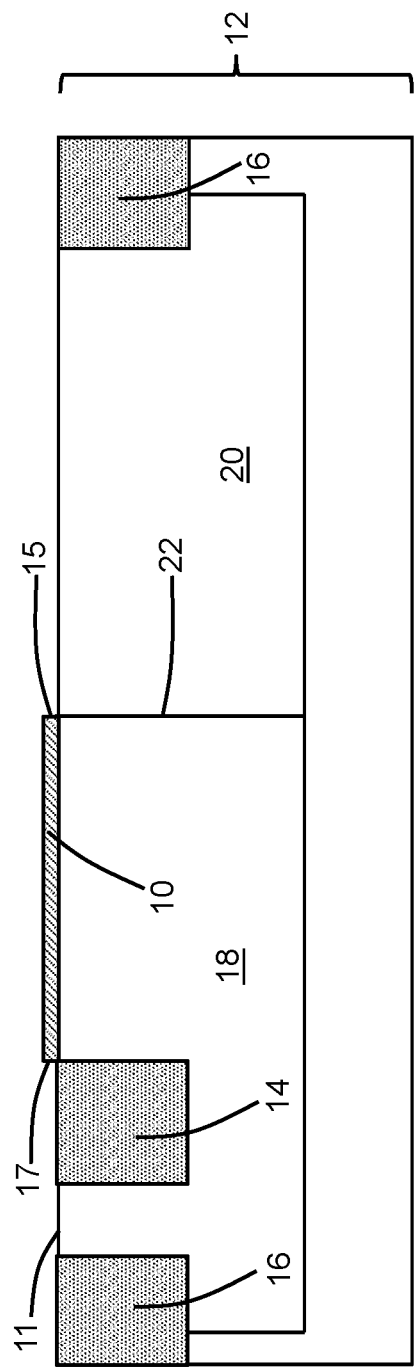
FIGS. 1-2 are cross-sectional views of a structure at successive fabrication stages of a processing method in accordance with embodiments of the invention.

With reference to FIG. 1 and in accordance with embodiments of the invention, a semiconductor layer 10 is formed on a top surface 11 of a semiconductor substrate 12. The semiconductor substrate 12 may be comprised of a single-crystal semiconductor material, such as single-crystal silicon, and may be lightly doped to have p-type conductivity. The semiconductor layer 10 may be in direct contact with the top surface 11 of the semiconductor substrate 12. The semiconductor layer 10 may be formed by depositing and patterning a hard mask with lithography and etching processes to provide an opening defining a patterned area exposed on the top surface 11, and then growing the semiconductor layer 10 with a selective epitaxial growth process in the patterned area. Alternatively, the semiconductor layer 10 may be formed by a condensation process using a patterned hardmask. In an alternative embodiment, the semiconductor layer 10 may be formed in a recess that is patterned in the top surface 11 of the semiconductor substrate 12. In an embodiment, the semiconductor layer 10 may be comprised of silicon-germanium (SiGe) containing silicon and germanium in a given atomic ratio. In an embodiment, the semiconductor layer 10 may be comprised of silicon-germanium (SiGe) having a germanium content ranging from about 2 atomic percent to about 50 atomic percent. In an embodiment, the thickness of the semiconductor layer 10 may range from about 3 nanometers (nm) to about 10 nm.

Shallow trench isolation regions 14, 16 are formed in the semiconductor substrate 12. The shallow trench isolation regions 14, 16 may be formed by patterning shallow trenches in the semiconductor substrate 12 with lithography and etching processes, depositing a dielectric material to fill the shallow trenches, and planarizing and/or recessing the dielectric material. The shallow trench isolation regions 14, 16 may contain silicon dioxide deposited by chemical vapor deposition and planarized by chemical-mechanical polishing. In an embodiment, the shallow trench isolation regions 14, 16 may be formed before the semiconductor layer 10 is formed. In an alternative embodiment, the shallow trench isolation regions 14, 16 may be formed after the semiconductor layer 10 is formed.

Wells 18, 20 are also formed in the semiconductor substrate 12. The well 18 is comprised of a semiconductor material doped to have an opposite conductivity type from the semiconductor material of the well 20. The well 18 may be formed by introducing a dopant by, for example, ion implantation with given implantation conditions into the semiconductor substrate 12. The well 20 may be formed by introducing a different dopant of opposite conductivity type by, for example, ion implantation with given implantation conditions into the semiconductor substrate 12. A patterned implantation mask may be formed to define a selected area on the top surface 11 that is exposed for each individual implantation. The implantation masks cover different areas on the top surface 11 in order to determine, at least in part, the location and lateral dimensions of the wells 18, 20. Each implantation mask may include a layer of a material, such as an organic photoresist, that is applied and patterned such that areas on the top surface 11 are covered and masked. Each implantation mask has a thickness and stopping power sufficient to block the masked areas against receiving a dose of the implanted ions.

The implantation conditions (e.g., ion species, dose, kinetic energy) may be selected to tune the electrical and physical characteristics (e.g., electrical resistivity and depth profile) of the well 18. A separate set of implantation conditions (e.g., ion species, dose, kinetic energy) may be selected to tune the electrical and physical characteristics (e.g., electrical resistivity and depth profile) of the well 20. In an embodiment in which the semiconductor substrate 12 has p-type conductivity, the well 18 may contain semiconductor material doped with an n-type dopant (e.g., phosphorus and/or arsenic) to provide n-type conductivity, and the well 20 may contain semiconductor material doped with a p-type dopant (e.g., boron) to provide p-type conductivity.

The well 18 may provide a body of an extended-drain metal-oxide-semiconductor device. The well 20, which may be lightly doped, may function as a high-voltage drift region in the extended-drain metal-oxide-semiconductor device. The wells 18, 20 may adjoin along an interface 22 at which the conductivity type of the semiconductor material changes to define a p-n junction. In an embodiment, the wells 18, 20 may be formed before the semiconductor layer 10 is formed. In an alternative embodiment, the wells 18, 20 may be formed after the semiconductor layer 10 is formed.

The semiconductor layer 10 may terminate at an edge 15 and also terminate at an edge 17 that is opposite to the edge 15. The edge 17 of the semiconductor layer 10 is located adjacent to the shallow trench isolation region 14, and the opposite edge 15 of the semiconductor layer 10 is located proximate to the interface 22. The semiconductor layer 10 overlaps at least in part with the well 18 and, in an embodiment, the entirety of the semiconductor layer 10 may overlap with the well 18.

Figure 2:
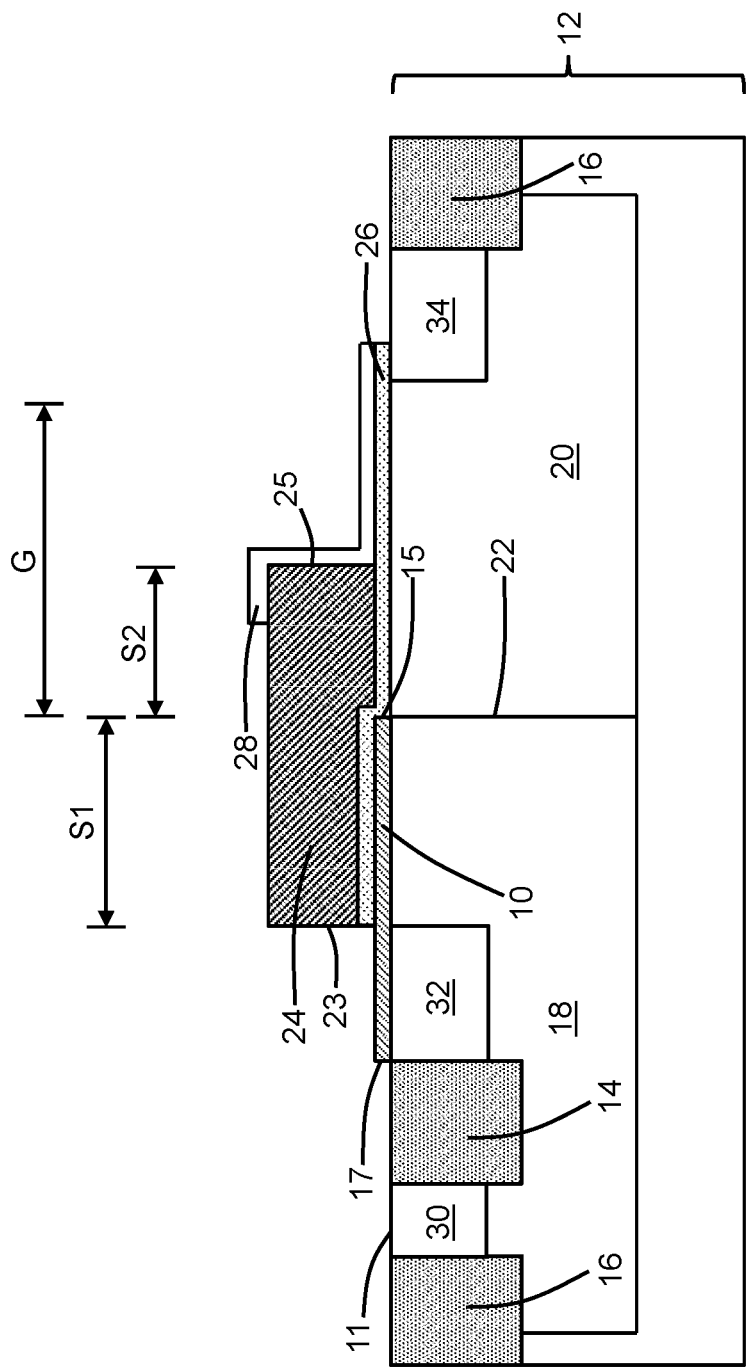

With reference to FIG. 2 in which like reference numerals refer to like features in FIG. 1 and at a subsequent fabrication stage, a gate electrode 24 and a gate dielectric 26 of the extended-drain metal-oxide-semiconductor device are formed on the top surface 11 of the semiconductor substrate 12. The gate dielectric 26 is positioned in a vertical direction between the gate electrode 24 and the top surface 11. The interface 22 between the wells 18, 20 is positioned in the semiconductor substrate 12 beneath the gate electrode 24 and gate dielectric 26. In an embodiment, the gate electrode 24 may be a metal gate that includes a work-function metal, such as a layer stack including a work-function metal and silicided polysilicon, and the gate dielectric 26 may be comprised of a high-k dielectric material, such as hafnium oxide.

The gate electrode 24 includes a sidewall 23 and a sidewall 25 that is opposite to the sidewall 23. A dielectric layer 28 is formed that covers the sidewall 25 of the gate electrode 24, a portion of the gate electrode 24 adjacent to the sidewall 25, and a portion of the well 20 that is laterally between the doped region 34 and the gate electrode 24. The dielectric layer 28 may be comprised of silicon nitride that is conformally deposited and then patterned with lithography and etching processes.

A doped region 30, a doped region 32, and a doped region 34 are formed in the semiconductor substrate 12. The doped region 30 has a conductivity of a polarity opposite to the conductivity of the doped regions 32, 34. In an embodiment in which the well 18 has n-type conductivity and the well 20 has p-type conductivity, the semiconductor materials of the doped regions 32, 34 may be doped with an p-type dopant to provide p-type conductivity, and the semiconductor material of the doped region 30 may be doped with an n-type dopant (e.g., phosphorus and/or arsenic) to provide n-type conductivity. The doped region 30 may be formed by implanting ions (e.g., ions of the n-type dopant) with an implantation mask formed on the top surface 11 and defining the intended location for the doped region 30 in the semiconductor substrate 12. The doped regions 32, 34 may be formed by implanting ions (e.g., ions of the p-type dopant) with a different implantation mask formed on the top surface 11 and defining the intended locations for the doped regions 32, 34 in the semiconductor substrate 12.

The doped region 30, which is positioned in the well 18, is doped to have the same conductivity type as the well 18 but at a higher dopant concentration than the well 18. The doped region 32, which is also positioned in the well 18, is doped to have an opposite conductivity type from the well 18. The doped region 34, which is positioned in the well 20, is doped to have the same conductivity type as the well 20 but at a higher dopant concentration than the well 20.

The doped region 32 provides a source region of the extended-drain metal-oxide-semiconductor device and the doped region 34 provides a drain region of the extended-drain metal-oxide-semiconductor device. The sidewall 23 of the gate electrode 24 is positioned adjacent to the doped region 32, and the sidewall 25 of the gate electrode 24 is positioned adjacent to the doped region 34. In an embodiment, the doped region 32 may be self-aligned to the sidewall 23 of the gate electrode 24. The doped region 32 is positioned beneath the semiconductor layer 10 with an overlapping relationship. In an embodiment, the semiconductor layer 10 may fully overlap the doped region 32.

In an embodiment, the edge 15 of the semiconductor layer 10 and the interface 22 between the well 18 and the well 20 may be coplanar. In an embodiment, the edge 15 of the semiconductor layer 10 may be substantially coplanar with the interface 22 between the well 18 and the well 20. The edge 15 of the semiconductor layer 10 is laterally spaced from the doped region 34 by a gap G such that the semiconductor layer 10 does not overlap with the doped region 34. The semiconductor layer 10 projects laterally from beneath the gate electrode 24 such that a portion of the semiconductor layer 10 is positioned between the edge 17 and the sidewall 23 of the gate electrode 24.

The interface 22 between the well 18 and the well 20 is located in a lateral direction between the sidewalls 23, 25 of the gate electrode 24. The gate electrode 24 has a section S1 that overlaps with the semiconductor layer 10 and the well 18 beneath the semiconductor layer 10, and the gate electrode 24 has a section S2 that overlaps with the well 20 with the semiconductor layer 10 absent. The section S1 is laterally positioned between the doped region 32 and the section S2, and the section S2 is laterally positioned between the doped region 34 and the section S1. The gate dielectric 26 is positioned in a vertical direction between the section S1 of the gate electrode 24 and the semiconductor layer 10, and is also positioned in the vertical direction between the section S2 of the gate electrode 24 and the semiconductor substrate 12. The edge 15 terminating the semiconductor layer 10 is positioned beneath the gate electrode 24 at a transition from the section S1 to the section S2. As a result, the different sections S1, S2 of the gate electrode 24 are positioned over semiconductor materials (e.g., silicon and silicon-germanium) of different composition.

Middle-of-line (MOL) processing and back-end-of-line (BEOL) processing follow, which includes formation of an interconnect structure coupled to the extended-drain metal-oxide-semiconductor device.

The semiconductor layer 10, which is only overlapped by the section S1 of the gate electrode 24 and not by the section S2 of the gate electrode 24, participates in providing a hybrid arrangement of diverse semiconductor materials beneath the gate electrode 24. The threshold voltage of the extended-drain metal-oxide-semiconductor device may be tuned by varying the amount of germanium in the semiconductor layer 10. The fabrication process for a metal-gate p-type extended-drain metal-oxide-semiconductor device may be simplified because the threshold voltage may be tuned (e.g., reduced) without the need for a mask to perform a well implant, as may be conventionally used for threshold voltage tuning. The tuning of the threshold voltage may be achieved without degrading other performance parameters, such as the linear drain current, of the p-type extended-drain metal-oxide-semiconductor device because, for example, the section S2 of the gate electrode 24 does not overlap with the semiconductor layer 10.

In use, the extended-drain metal-oxide-semiconductor device may be deployed as a switch in a high-voltage integrated circuit. When a gate voltage greater than the threshold voltages is applied to the gate electrode 24, the extended-drain metal-oxide-semiconductor device is switched "on", and current flows through the wells 18, 20 between the doped regions 32, 34. The extended drain provided by the well 20 operates as a high-resistance drift region that increases the voltage handling capability of the extended-drain metal-oxide-semiconductor device during operation.

Figure 3:
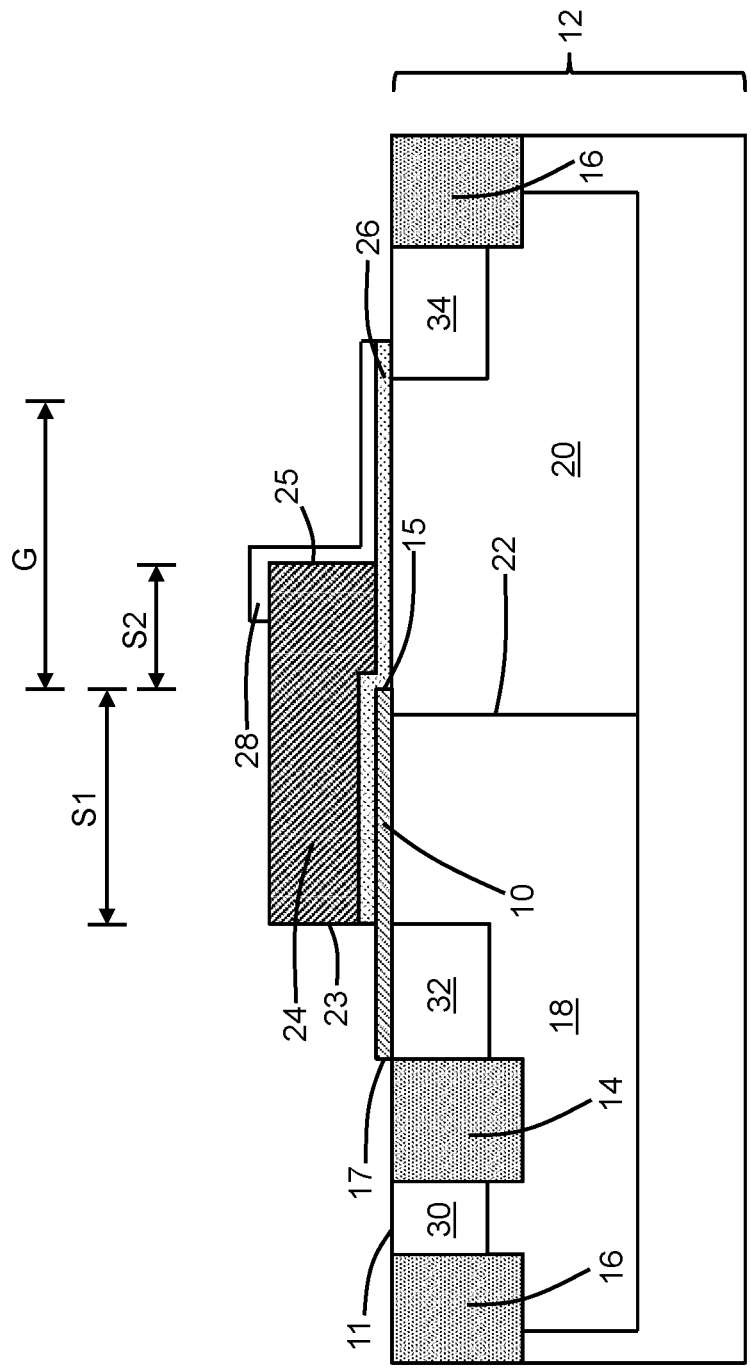
FIGS. 3-5 are cross-sectional views of structures in accordance with alternative embodiments of the invention.

With reference to FIG. 3 and in accordance with embodiments of the invention, the semiconductor layer 10 may be modified to extend past the interface 22 such that the semiconductor layer 10 includes a portion positioned in a vertical direction over the well 18 and a portion positioned in a vertical direction over the well 20. The portion of the semiconductor layer 10 over the well 20 is positioned in a lateral direction such that the edge 15 is located between the interface 22 and the doped region 34 providing the drain region of the extended-drain metal-oxide-semiconductor device.

Figure 4:
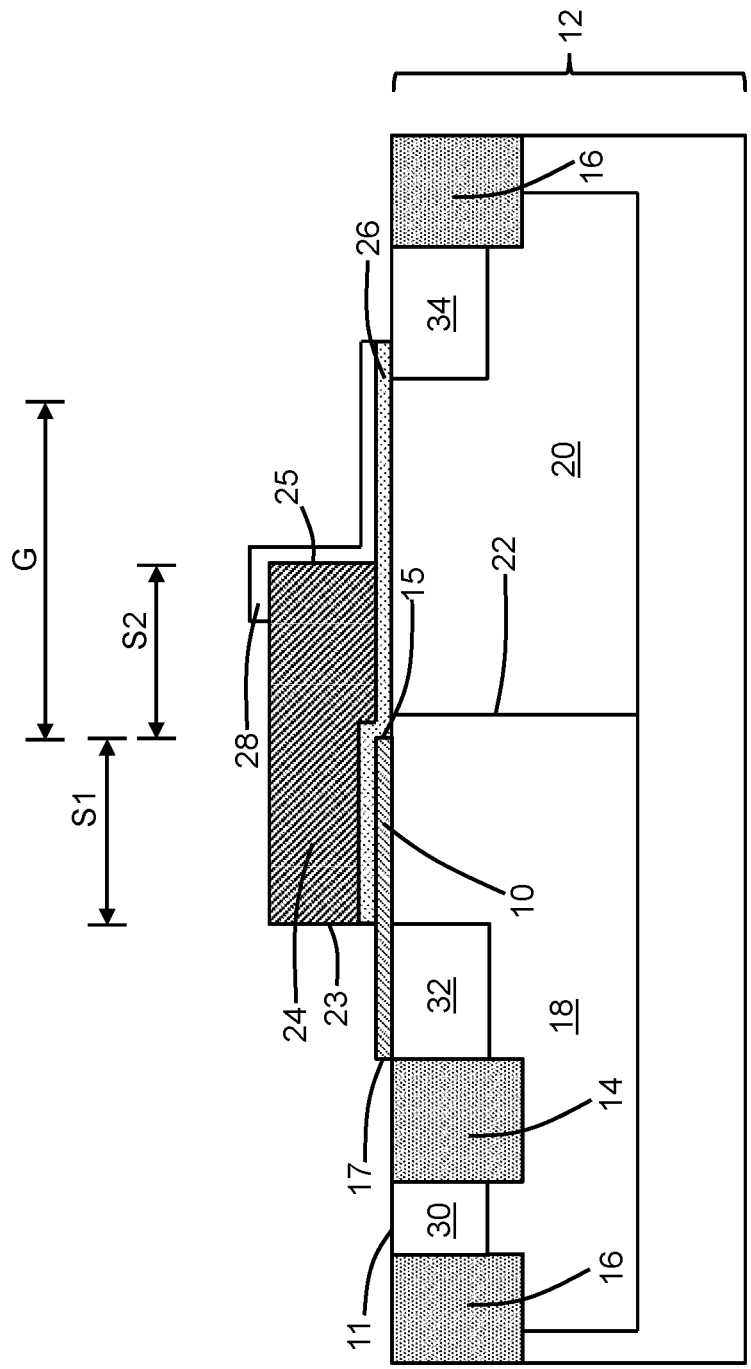

With reference to FIG. 4 and in accordance with embodiments of the invention, the semiconductor layer 10 may be modified to be fully positioned in a lateral direction between the interface 22 and the doped region 32 providing the source region of the extended-drain metal-oxide-semiconductor device. The edge 15 of the semiconductor layer 10 is laterally spaced from the interface 22 by a portion of the well 18.

Figure 5:
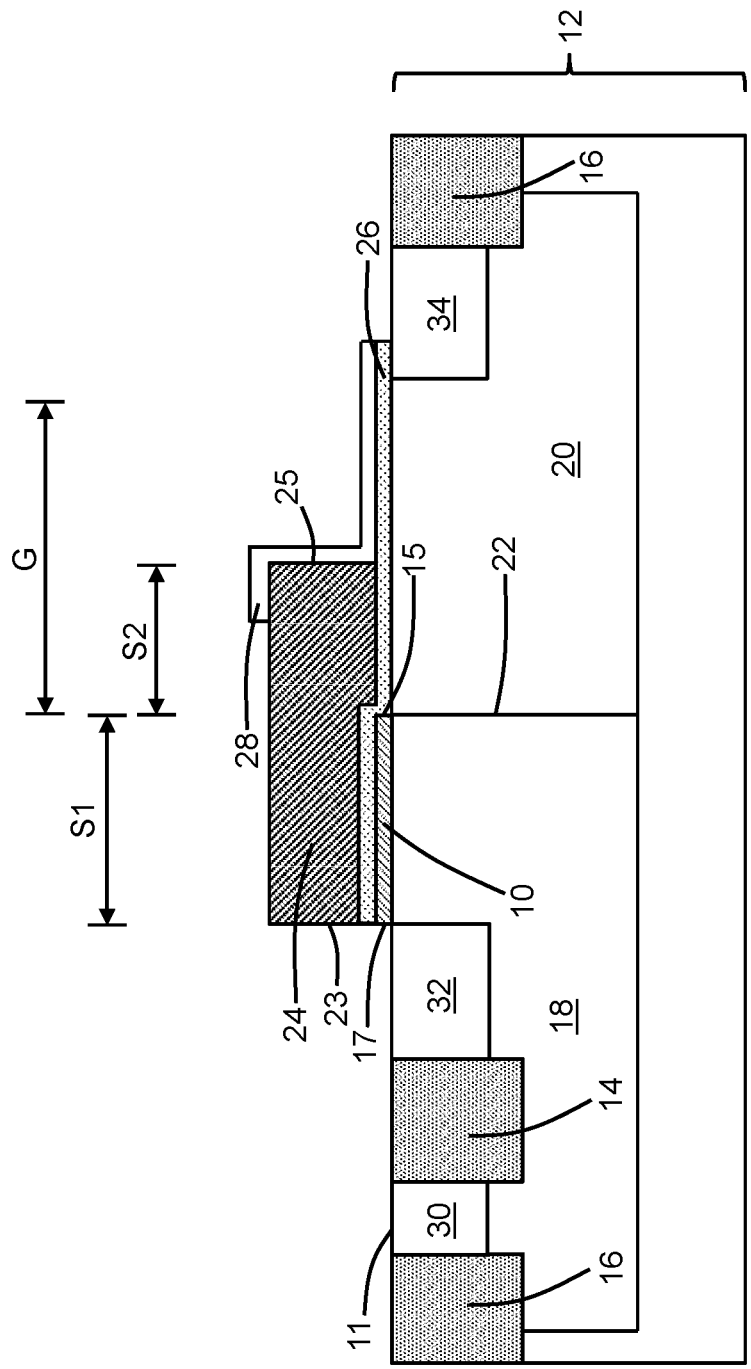

With reference to FIG. 5 and in accordance with embodiments of the invention, the semiconductor layer 10 may be modified such that the semiconductor layer 10 is not positioned over the doped region 32. Instead, the semiconductor layer 10 is fully positioned in a vertical direction between the gate electrode 24 and the semiconductor substrate 12. The edge 17 may terminate at the sidewall 23 of the gate electrode 24 and not overlap with the doped region 32. In alternative embodiments, the edge 15 of the semiconductor layer 10 may be positioned relative to the interface 22 as shown in FIGS. 3 and 4.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an extended-drain metal-oxide-semiconductor device, the structure comprising:

a semiconductor substrate comprising a first semiconductor material;

a first well in the semiconductor substrate;
a second well in the semiconductor substrate, the second well adjoining the first well along an interface;
a source region and a drain region in the semiconductor substrate, the source region positioned in the first well, and the drain region positioned in the second well;
a semiconductor layer positioned on the semiconductor substrate, the semiconductor layer comprising a second semiconductor material that differs in composition from the first semiconductor material, and the semiconductor layer having an edge that is approximately aligned with the interface;
a gate electrode positioned in a lateral direction between the source region and the drain region, the gate electrode including a first section positioned on a first portion of the semiconductor layer and a second section positioned on the semiconductor substrate; and
a gate dielectric including a first portion in direct contact with the first portion of the semiconductor layer and a second portion in direct contact with the semiconductor substrate, the first portion of the gate dielectric positioned in a vertical direction between the first section of the gate electrode and the first portion of the semiconductor layer, and the second portion of the gate dielectric positioned in the vertical direction between the second section of the gate electrode and the semiconductor substrate,
wherein the first portion of the semiconductor layer is positioned in the vertical direction between the first well and the first section of the gate electrode.

2. The structure of claim 1 wherein the first semiconductor material is silicon, and the second semiconductor material is silicon-germanium.

3. The structure of claim 1 wherein the semiconductor layer includes a second portion that is positioned over the source region.

4. A structure for an extended-drain metal-oxide-semiconductor device, the structure comprising:
a semiconductor substrate comprising a first semiconductor material;
a first well in the semiconductor substrate;
a second well in the semiconductor substrate, the second well adjoining the first well along an interface;
a source region and a drain region in the semiconductor substrate, the source region positioned in the first well, and the drain region positioned in the second well;
a semiconductor layer positioned on the semiconductor substrate, the semiconductor layer comprising a second semiconductor material that differs in composition from the first semiconductor material, and the semiconductor layer having an edge that is approximately aligned with the interface;
a gate electrode positioned in a lateral direction between the source region and the drain region, the gate electrode including a first section positioned on a first portion of the semiconductor layer and a second section positioned on the semiconductor substrate; and
a gate dielectric including a first portion in direct contact with the first portion of the semiconductor layer and a second portion in direct contact with the semiconductor substrate, the first portion of the gate dielectric positioned in a vertical direction between the first section of the gate electrode and the first portion of the semiconductor layer, and the second portion of the gate dielectric positioned in the vertical direction between the second section of the gate electrode and the semiconductor substrate,
wherein the first portion of the semiconductor layer and the first section of the gate electrode are positioned over a portion of the first well and over a portion of the second well.

5. The structure of claim 4 wherein the semiconductor layer includes a second portion that is positioned over the source region.

6. The structure of claim 1 wherein the gate electrode comprises a work-function metal, and the gate dielectric comprises a high-k dielectric material.

7. The structure of claim 1 wherein the gate electrode comprises a work-function metal, and the source region and the drain region have p-type conductivity.

8. The structure of claim 1 wherein the first section of the gate electrode is laterally positioned adjacent to the source region, and the second section of the gate electrode is laterally positioned between the first section of the gate electrode and the drain region.

9. A method of forming a structure for an extended-drain metal-oxide-semiconductor device, the method comprising:
forming a first well in a semiconductor substrate, wherein the semiconductor substrate comprises a first semiconductor material;
forming a second well in the semiconductor substrate, wherein the second well adjoins the first well along an interface;
forming a semiconductor layer positioned on the semiconductor substrate, wherein the semiconductor layer comprises a second semiconductor material that differs in composition from the first semiconductor material;
forming a source region and a drain region in the semiconductor substrate, wherein the source region is positioned in the first well, and the drain region is positioned in the second well;
forming a gate electrode positioned in a lateral direction between the source region and the drain region, wherein the gate electrode includes a first section positioned on a first portion of the semiconductor layer and a second section positioned over the semiconductor substrate; and
forming a gate dielectric including a first portion in direct contact with the first portion of the semiconductor layer and a second portion in direct contact with the semiconductor substrate, the first portion of the gate dielectric positioned in a vertical direction between the first section of the gate electrode and the first portion of the semiconductor layer, and the second portion of the gate dielectric positioned in the vertical direction between the second section of the gate electrode and the semiconductor substrate,
wherein the first portion of the semiconductor layer and the first section of the gate electrode are positioned over a portion of the first well and over a portion of the second well.

10. The method of claim 9 wherein the first semiconductor material is silicon, and the second semiconductor material is silicon-germanium.

11. The method of claim 9 wherein the first section of the gate electrode is positioned adjacent to the source region, and the second section of the gate electrode is laterally positioned between the first section of the gate electrode and the drain region.

12. The method of claim 9 wherein the semiconductor layer includes a second portion that is positioned over the source region.

13. The method of claim 9 wherein the gate electrode comprises a work-function metal, the gate dielectric comprises a high-k dielectric material, and the source region and the drain region have p-type conductivity.

14. The structure of claim 4 wherein the first semiconductor material is silicon, and the second semiconductor material is silicon-germanium.

15. The structure of claim 4 wherein the first section of the gate electrode is positioned adjacent to the source region, and the second section of the gate electrode is laterally positioned between the first section of the gate electrode and the drain region.

16. The structure of claim 4 wherein the gate electrode comprises a work-function metal, and the source region and the drain region have p-type conductivity.

17. The structure of claim 1 wherein the edge of the semiconductor layer is located between the interface and the drain region.

18. The structure of claim 1 wherein the semiconductor layer is fully positioned in the lateral direction between the interface and the source region.

19. The structure of claim 2 wherein the silicon-germanium has a germanium content ranging from about 2 atomic percent to about 50 atomic percent, and the semiconductor layer has a thickness ranging from about 3 nanometers to about 10 nanometers.

20. The structure of claim 14 wherein the silicon-germanium has a germanium content ranging from about 2 atomic percent to about 50 atomic percent, and the semiconductor layer has a thickness ranging from about 3 nanometers to about 10 nanometers.

* * * * *